(12) United States Patent
Takahashi et al.

(10) Patent No.: US 11,495,589 B2
(45) Date of Patent: Nov. 8, 2022

(54) OPTICAL MODULE AND MANUFACTURING METHOD OF OPTICAL MODULE

(71) Applicant: FUJITSU OPTICAL COMPONENTS LIMITED, Kawasaki (JP)

(72) Inventors: Kento Takahashi, Kawasaki (JP); Teruhiro Kubo, Kitahiroshima (JP); Hiroshi Kobayashi, Kawasaki (JP)

(73) Assignee: FUJITSU OPTICAL COMPONENTS LIMITED, Kawasaki (JP)

( * ) Notice: Subject to any disclaimer, the term of this patent is extended or adjusted under 35 U.S.C. 154(b) by 10 days.

(21) Appl. No.: 16/806,256

(22) Filed: Mar. 2, 2020

(65) Prior Publication Data
US 2020/0286874 A1     Sep. 10, 2020

(30) Foreign Application Priority Data

Mar. 5, 2019     (JP) .............................. JP2019-039752

(51) Int. Cl.
*H01L 25/16*     (2006.01)
*H01L 23/00*     (2006.01)
(Continued)

(52) U.S. Cl.
CPC ........ *H01L 25/167* (2013.01); *H01L 21/4853* (2013.01); *H01L 21/565* (2013.01);
(Continued)

(58) Field of Classification Search
CPC . H01L 25/167; H01L 21/4853; H01L 21/565; H01L 23/3157; H01L 23/49838; H01L 23/66; H01L 24/16
See application file for complete search history.

(56) References Cited

U.S. PATENT DOCUMENTS 6,639,322 B1 * 10/2003 Welstand .............. H01L 21/563
                                                      257/728
8,487,430 B1 *  7/2013 Walworth ........... H01L 25/0657
                                                      257/728
(Continued)

FOREIGN PATENT DOCUMENTS

JP              9-64238        3/1997
JP          2000-269384        9/2000
(Continued)

OTHER PUBLICATIONS

Honda Susumu, Mechanical Connection Technology, and Printed Circuit Technical Manual 3rd Edition, 3rd Edition, Nikkan Kogyo Shimbun Chino (9 pp.).
Office Action, dated Sep. 13, 2022, in corresponding Japanese Patent Application No. 2019-039752 (10 pp.).

*Primary Examiner* — Shaun M Campbell
(74) *Attorney, Agent, or Firm* — Staas & Halsey LLP

(57) ABSTRACT

An optical module includes an optical semiconductor chip including a first electrode pad, a second electrode pad, and a third electrode pad arranged between the first electrode pad and the second electrode pad, a wiring substrate on which the optical semiconductor chip is flip-chip mounted, including a fourth electrode pad, a fifth electrode pad, and a sixth electrode pad arranged between the fourth electrode pad and the fifth electrode pad, a first conductive material connecting the first electrode pad with the fourth electrode pad, a second conductive material connecting the second electrode pad with the fifth electrode pad, a third conductive material arranged between the first conductive material and the second conductive material, connecting the third electrode pad with the sixth electrode pad, and a resin provided in an area on the second conductive material side of the third conductive material between the optical semiconductor chip and the wiring substrate.

14 Claims, 19 Drawing Sheets

(51) Int. Cl.
    *H01L 23/31*         (2006.01)
    *H01L 23/498*      (2006.01)
    *H01L 23/66*         (2006.01)
    *H01P 11/00*       (2006.01)
    *H01L 21/48*        (2006.01)
    *H01L 21/56*        (2006.01)
    *H01P 3/00*          (2006.01)

(52) U.S. Cl.
    CPC .... *H01L 23/3157* (2013.01); *H01L 23/49838* (2013.01); *H01L 23/66* (2013.01); *H01L 24/16* (2013.01); *H01P 3/003* (2013.01); *H01P 11/003* (2013.01); *H01L 2223/6627* (2013.01); *H01L 2223/6638* (2013.01); *H01L 2224/16227* (2013.01)

(56) References Cited

U.S. PATENT DOCUMENTS

| | | |
|---|---|---|
| 9,607,863 B1 | 3/2017 | Lee |
| 9,978,707 B1* | 5/2018 | Zimmerman ........... H01L 24/32 |
| 2010/0164079 A1 | 7/2010 | Dekker et al. |
| 2016/0299361 A1* | 10/2016 | Cheung .................. H01P 5/085 |
| 2020/0303822 A1* | 9/2020 | Yao .................. H01L 23/49816 |

FOREIGN PATENT DOCUMENTS

| | | |
|---|---|---|
| JP | 2009-500820 | 1/2009 |
| JP | 2009188026 A * | 8/2009 |
| JP | 2017-199937 | 11/2017 |

\* cited by examiner

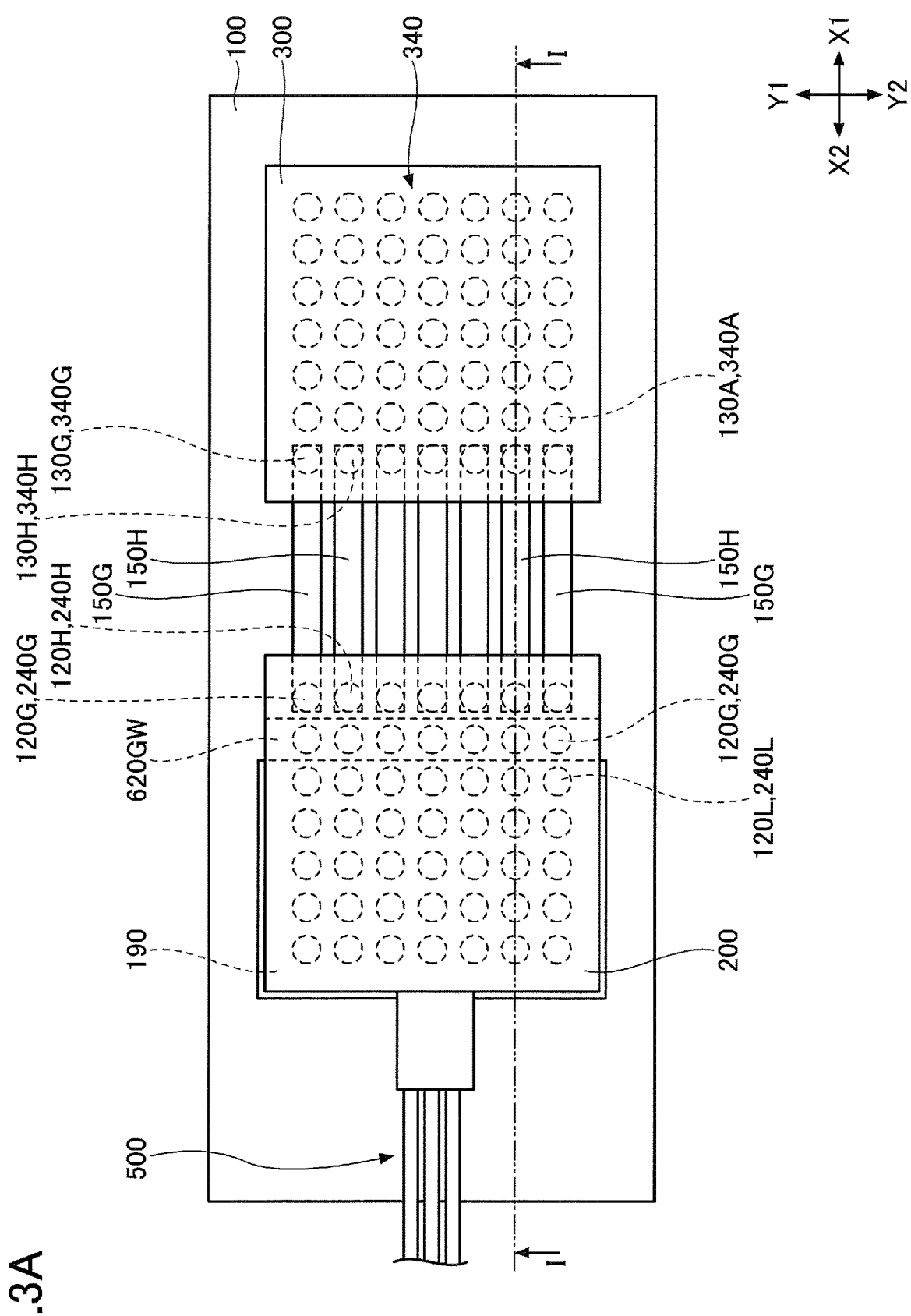

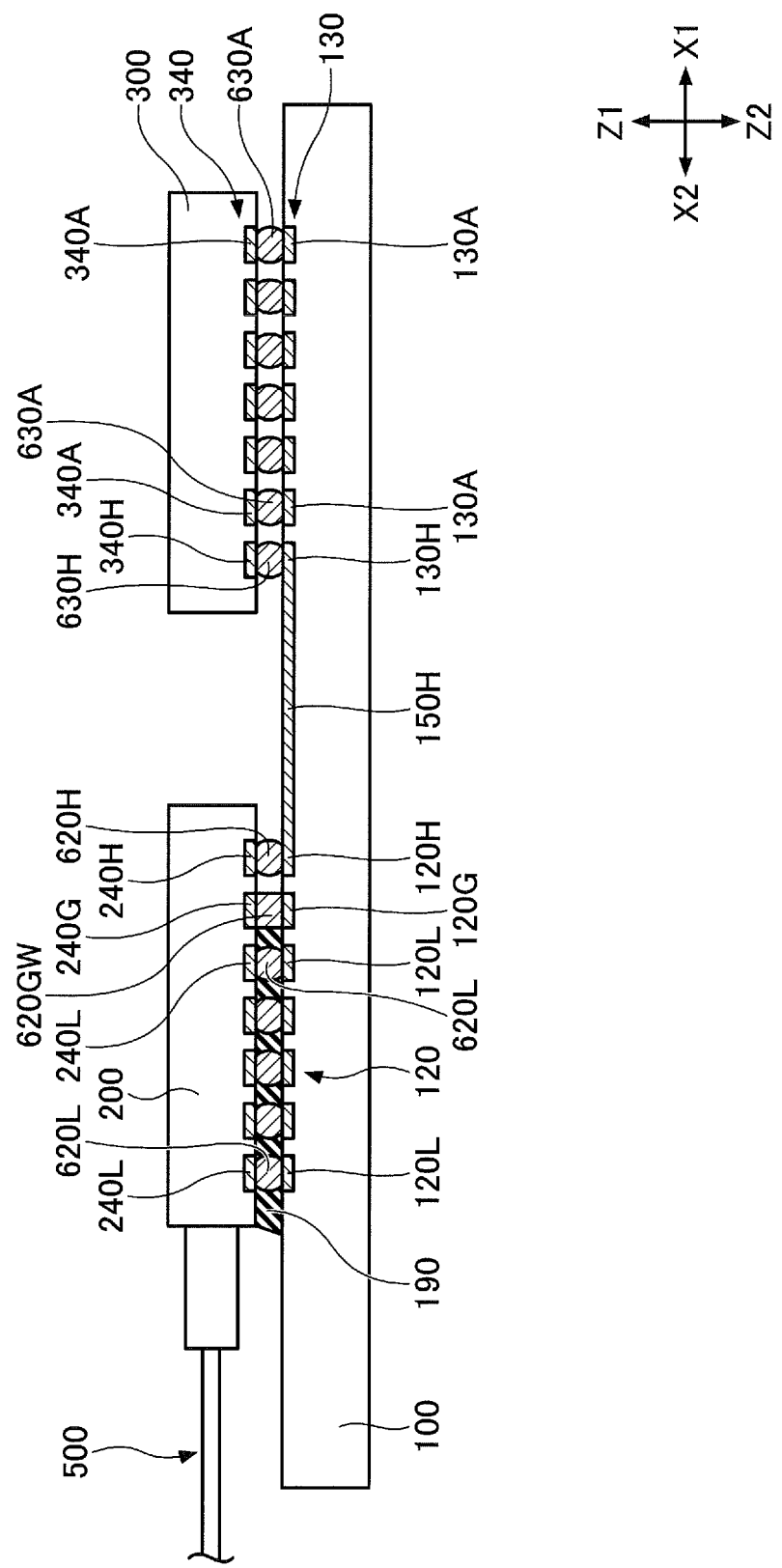

OPTICAL MODULE AND MANUFACTURING METHOD OF OPTICAL MODULE

CROSS-REFERENCE TO RELATED APPLICATIONS

The present application is based upon and claims the benefit of priority from the prior Japanese Patent Application No. 2019-039752 filed on Mar. 5, 2019, with the Japanese Patent Office, the entire contents of which are incorporated herein by reference.

FIELD

The disclosures herein relate to an optical module and a manufacturing method of an optical module.

BACKGROUND

For an optical semiconductor chip of coherent optical transmission, it is desired that the size is reduced and the number of pins is increased. Thus, an optical semiconductor of a ball grid array (BGA) package may be used for an optical module.

RELATED-ART DOCUMENTS

Patent Document

[Patent Document 1] Japanese Laid-Open Patent Publication No. 09-64238
[Patent Document 2] Japanese Laid-Open Patent Publication No. 2000-269384
[Patent Document 3] U.S. Pat. No. 9,607,863

SUMMARY

According to an aspect of the embodiment, an optical module includes an optical semiconductor chip including a first electrode pad, a second electrode pad, and a third electrode pad arranged between the first electrode pad and the second electrode pad, a wiring substrate on which the optical semiconductor chip is flip-chip mounted, including a fourth electrode pad, a fifth electrode pad, and a sixth electrode pad arranged between the fourth electrode pad and the fifth electrode pad, a first conductive material connecting the first electrode pad with the fourth electrode pad, a second conductive material connecting the second electrode pad with the fifth electrode pad, a third conductive material arranged between the first conductive material and the second conductive material, connecting the third electrode pad with the sixth electrode pad, and a resin provided in an area on the second conductive material side of the third conductive material between the optical semiconductor chip and the wiring substrate.

The object and advantages of the embodiment will be realized and attained by means of the elements and combinations particularly pointed out in the claims. It is to be understood that both the foregoing general description and the following detailed description are exemplary and explanatory and are not restrictive of the invention, as claimed.

BRIEF DESCRIPTION OF DRAWINGS

FIG. 3A is a plan view illustrating a structure of an optical module according to a first embodiment;

FIG. 3B is a cross-sectional view illustrating a structure of an optical module according to a first embodiment;

DESCRIPTION OF EMBODIMENTS

Figure 1:
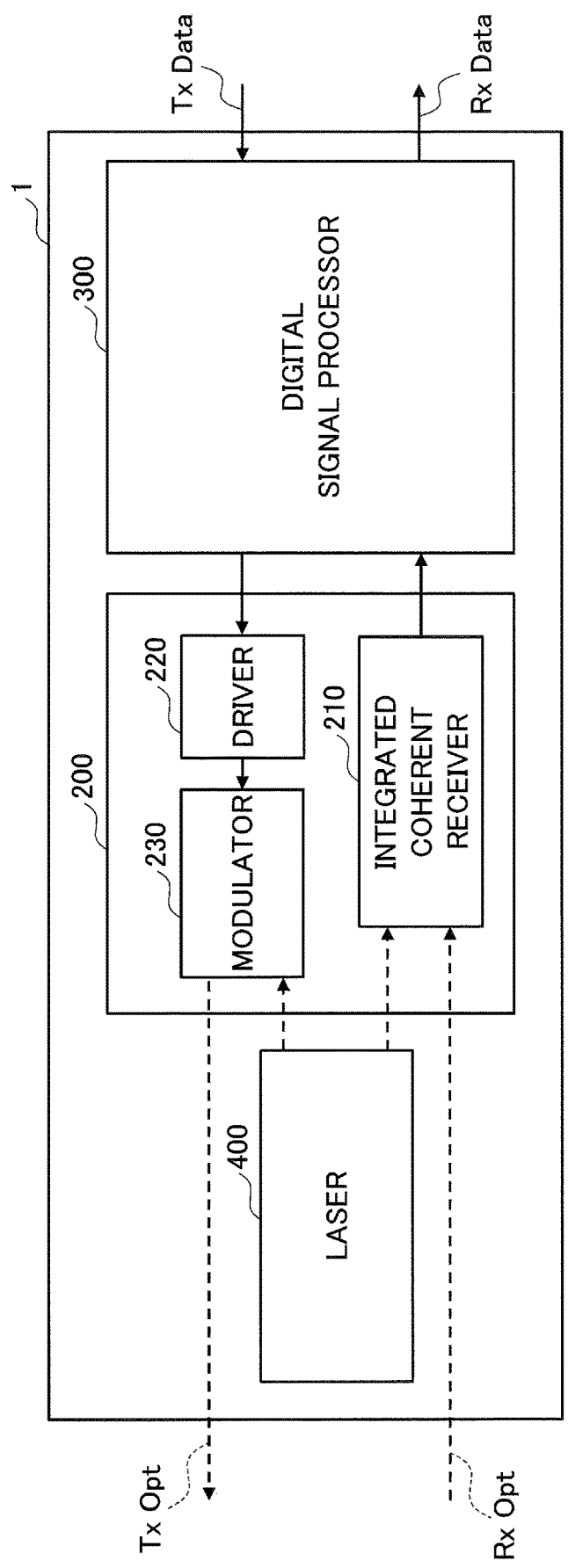
FIG. 1 is a block diagram illustrating a configuration of an optical module according to a first embodiment.

In an optical module of related art using an optical semiconductor chip of the BGA package, miniaturizing with maintaining a good high-frequency characteristic is difficult.

The present inventors have earnestly examined to clarify a reason why further miniaturizing with maintaining a good high-frequency characteristic is difficult.

For miniaturization of an optical semiconductor chip, a pitch of solder balls of the BGA is decreased, and a diameter of solder balls of the BGA is reduced. The smaller a diameter is, the smaller a stress causing a crack of a solder ball is, and connection reliability is easily decreased. In order to control against a decrease of connection reliability, it is effective that liquid resin, which is called underfill, is poured into a space between an optical semiconductor chip and a wiring substrate, and is hardened. However, when a space between an optical semiconductor chip and a wiring substrate is filled with underfill, a characteristic impedance mismatch of a solder ball, in which a high-speed signal is transmitted, is caused by an influence of permittivity of resin. As a result, a high-frequency characteristic is decreased.

In the following, embodiments will be described specifically with reference to the accompanying drawings. In the present specification and drawings, the constituent elements having a substantially same functional configuration are denoted by the same reference numeral, and duplicated descriptions may be omitted. In the present disclosure, an X1-X2 direction, a Y1-Y2 direction, and a Z1-Z2 direction are mutually orthogonal. A plane including the X1-X2 direction and the Y1-Y2 direction is described as an XY plane, a plane including the Y1-Y2 direction and the Z1-Z2 direction is described as a YZ plane, and a plane including the Z1-Z2 direction and the X1-X2 direction is described as a ZX plane. For the purpose of convenience, the Z1-Z2 direction is a top-bottom direction. A planar view indicates that an object is viewed from a Z1 side.

First Embodiment

First, a first embodiment will be described. FIG. 1 is a block diagram illustrating a configuration of an optical module according to the first embodiment. In FIG. 1, a solid arrow line indicates a direction in which an electrical signal is transmitted, and a dotted arrow line indicates a direction in which an optical signal is transmitted.

An optical module 1 according to the first embodiment includes an optical semiconductor chip 200, a digital signal processor (DSP) 300, and a laser 400. The optical semiconductor chip 200 includes an integrated coherent receiver (ICR) 210, a driver 220, and a modulator 230.

The ICR 210 receives an optical signal (i.e., Rx Opt) output from the outside to the optical module 1 through an optical fiber 500 (see FIG. 3) and local light output from the laser 400, and the ICR 210 outputs an electrical signal. The DSP 300 receives an electrical signal output from the ICR 210, processes the electrical signal, and outputs a data signal (i.e., Rx Data) to the outside. The DSP 300 receives a data signal (i.e., Tx Data) from the outside, processes the data signal, and outputs a signal to the driver 220. The driver 220 drives the modulator 230 based on the signal output from the DSP 300. The modulator 230 is driven by the driver 220, and outputs an optical signal (i.e., Tx Opt) to the outside of the optical module 1 through the optical fiber 500, by modulating local light output from the laser 400.

Figure 2:
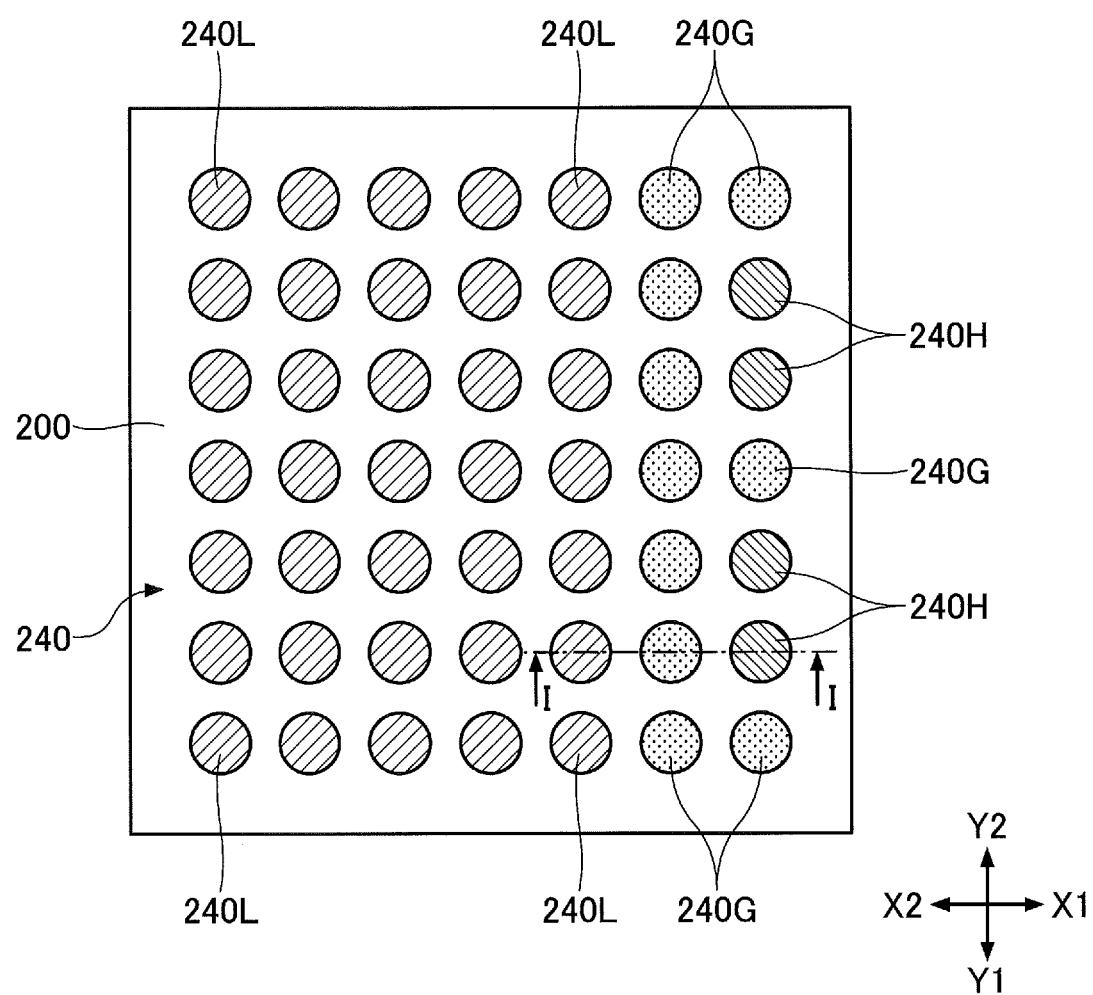
FIG. 2 is a bottom view illustrating a structure of an optical semiconductor chip included in an optical module according to a first embodiment.

FIG. 2 is a bottom view illustrating a structure of the optical semiconductor chip 200. The optical semiconductor chip 200 includes a ball grid array (BGA) package. As illustrated in FIG. 2, multiple electrode pads 240 are provided on the bottom surface of the optical semiconductor chip 200. The electrode pads 240 are arranged in a lattice. Some of the multiple electrode pads 240 are electrode pads 240H for a high-speed signal, other electrode pads are electrode pads 240G for grounding, and other electrode pads are electrode pads 240L for a low-speed signal. For example, a planar shape of the optical semiconductor chip 200 is a rectangle, and the electrode pads 240H are arranged and concentrated in proximity of an edge placed on the DSP 300 side (i.e., the X1 side) in a planar view. For example, differential signals are transmitted through two adjacent electrode pads 240H, and two electrode pads 240G are arranged such that two electrode pads 240H, in which differential signals are transmitted, are between the two electrode pads 240G. Additionally, the electrode pads 240G are arranged between the electrode pads 240H and the electrode pads 240L, in a direction toward a position on which a closest electrode pad 240 is arranged. The electrode pad 240H is an example of a first electrode pad, the electrode pad 240L is an example of a second electrode pad, and the electrode pad 240G arranged between the electrode pad 240H and the electrode pad 240L is an example of a third electrode pad.

FIG. 3A is a plan view illustrating a structure of the optical module according to the first embodiment. FIG. 3B is a cross-sectional view illustrating a structure of the optical module according to the first embodiment. FIG. 3B corresponds to a cross-sectional view taken along the line I-I in FIG. 3A.

Multiple electrode pads 120 are arranged in a lattice on the top surface of the wiring substrate 100 such that the electrode pads 120 are on the electrode pads 240 in a planar view. Some of the multiple electrode pads 120 are electrode pads 120H that are electrically connected to the electrode pads 240H, other electrode pads 120 are electrode pads 120G that are electrically connected to the electrode pads 240G, and other electrode pads 120 are electrode pads 120L that are electrically connected to the electrode pads 240L. The electrode pad 120H is an example of a fourth electrode pad, and the electrode pad 120L is an example of a fifth electrode pad. Some of the multiple electrode pads 120G are arranged between the electrode pads 120H and the electrode pads 120L, and are examples of a sixth electrode pad.

The optical semiconductor chip 200 is flip-chip mounted on the wiring substrate 100. One electrode pad 240H is electrically and mechanically connected to one electrode pad 120H through one cylinder-shaped conductive material 620H individually. One electrode pad 240L is electrically and mechanically connected to one electrode pad 120L through one cylinder-shaped conductive material 620L individually. For some of the multiple electrode pads 240G, one electrode pad 240G is electrically and mechanically connected to one electrode pad 120G through one cylinder-shaped conductive material 620G individually. Remaining multiple electrode pads 240G are electrically and mechanically connected to the multiple electrode pads 120G through one wall-shaped conductive material 620GW. A material of the conductive material 620H, the conductive material 620L, the conductive material 620G, and the conductive material 620GW is solder, for example. The conductive material 620H is an example of a first conductive material, the conductive material 620L is an example of a second conductive material, and the conductive material 620GW is an example of a third conductive material.

The DSP 300 also includes a BGA package, and is flip-chip mounted on the wiring substrate 100. Multiple electrode pads 340 are provided on the bottom surface of the DSP 300. The electrode pads 340 are arranged in a lattice. Some of the multiple electrode pads 340 are electrode pads 340H for a high-speed signal, other electrode pads are electrode pads 340G for grounding, and other electrode pads are electrode pads 340A used for another use. For example, a planar shape of the DSP 300 is a rectangle, and the electrode pads 340H are arranged and concentrated in proximity of an edge placed on the optical semiconductor chip 200 side in a planar view. For example, differential signals are transmitted through two adjacent electrode pads 340H, and two electrode pads 340G are arranged such that two electrode pads 340H, in which differential signals are transmitted, are between the two electrode pads 340G.

Multiple electrode pads 130 are arranged in a lattice on the top surface of the wiring substrate 100 such that the electrode pads 130 are on the electrode pads 340 in a planar view. Some of the multiple electrode pads 130 are electrode pads 130H that are electrically connected to the electrode pads 340H, other electrode pads 130 are electrode pads 130G that are electrically connected to the electrode pads 340G, and other electrode pads 130 are electrode pads 130A that are electrically connected to the electrode pads 340A. One electrode pad 340H is electrically and mechanically connected to one electrode pad 130H through one cylinder-shaped conductive material 630H individually. One electrode pad 340G is electrically and mechanically connected to one electrode pad 130G through one cylinder-shaped conductive material (which is not illustrated) individually. One electrode pad 340A is electrically and mechanically connected to one electrode pad 130A through one cylinder-shaped conductive material 630A individually. A material of the conductive material 630H, the conductive material (which is not illustrated) that connects the electrode pad 340G to the electrode pad 130G, and the conductive material 630A is solder, for example.

The wiring substrate 100 includes a signal line 150H connecting the electrode pad 120H to the electrode pad 130H, and a grounding wire 150G connecting the electrode pad 120G to the electrode pad 130G. For example, the signal line 150H is formed on a surface layer of the wiring substrate 100, and is a coplanar line or microstrip line, which extends in a straight direction. For example, multiple signal lines 150H are isometric wires. Additionally, the multiple signal lines 150H include two signal lines in which differential signals are transmitted, and two grounding wires 150G are arranged such that the two signal lines in which differential signals are transmitted, are between the two grounding wires 150G. Thus, the wiring substrate 100 includes a GSSG wiring formed of two signal lines 150H and two grounding wires 150G. For example, a characteristic impedance of the signal line 150H is about 50Ω, and a characteristic impedance matches between multiple signal lines 150H.

Figure 3C:
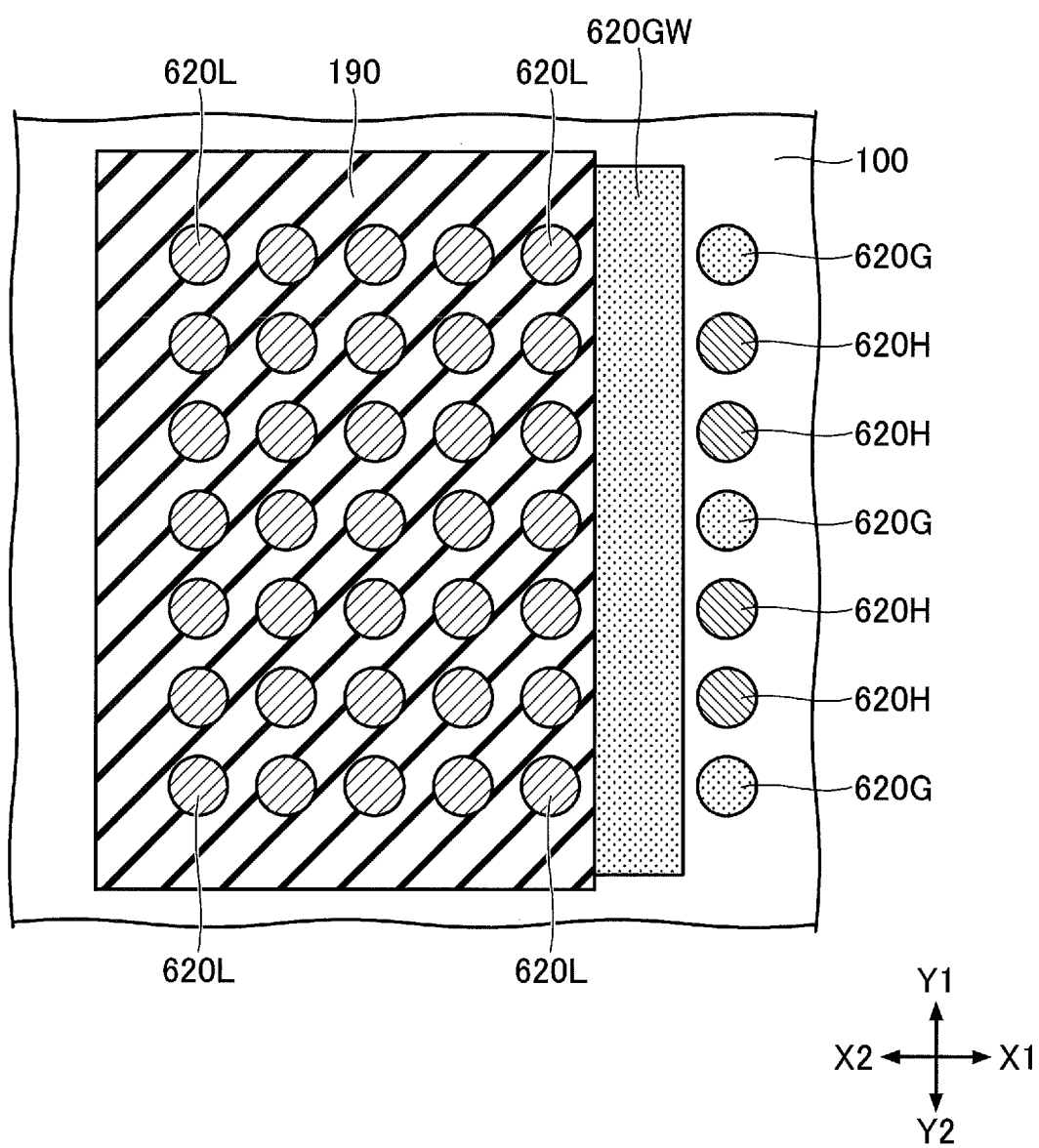
FIG. 3C is a drawing illustrating a relation between a wiring substrate, a conductive material, and underfill in a first embodiment.

As described above, the multiple electrode pads 240G are electrically and mechanically connected to the multiple electrode pads 120G through one conductive material 620GW. More specifically, a space between the wiring substrate 100 and the optical semiconductor chip 200 is divided into a space in which the conductive materials 620H are provided, and a space in which the conductive materials 620L are provided, by the conductive material 620GW. Thus, by the conductive material 620GW, a space in which the conductive materials 620H are provided and a space in which the conductive materials 620L are provided are separated from each other. In a space between the wiring substrate 100 and the optical semiconductor chip 200, a space in which the conductive materials 620L are provided is filled with underfill 190, and a space in which the conductive materials 620H are provided is not filled with the underfill 190. Thus, the underfill 190 is not provided around the conductive material 620H. In FIG. 3C, a relation between the wiring substrate 100, the conductive material 620H, the conductive material 620G, the conductive material 620L, and the underfill 190 in the first embodiment is illustrated. As illustrated in FIG. 3C for example, the conductive material 620L is in contact with the underfill 190, and the conductive material 620H is not in contact with the underfill 190. The underfill 190 is an example of resin.

In the optical module 1 according to the first embodiment, a signal of which maximum frequency is greater than or equal to 30 GHz is transmitted through the signal line 150H between the optical semiconductor chip 200 and the DSP 300, for example. Thus, maximum frequency of a signal that is transmitted through the conductive material 620H is greater than or equal to 30 GHz. Speed of a signal that is transmitted through the conductive material 620H (i.e., first speed) is greater than speed of a signal that is transmitted through the conductive material 620L (i.e., second speed). The conductive material 620G and the conductive material 620GW are grounded.

According to the optical module 1, high strength can be obtained even when a size is reduced because the underfill 190 is provided. Additionally, a decrease of high-frequency characteristic caused by permittivity of the underfill 190 can be avoided because the underfill 190 is formed in an area on the conductive material 620L side of the wall-shaped conductive material 620GW, and is not formed in an area on the conductive material 620H side.

As a space on the conductive material 620L side and a space on the conductive material 620H side are separated by the conductive material 620GW used as a grounded line between the wiring substrate 100 and the optical semiconductor chip 200, it is not necessary to form a member used for only separation. Thus, it can control against an increase in cost.

Next, in a manufacturing method of the optical module 1 according to the first embodiment, a method of mounting the optical semiconductor chip 200 on the wiring substrate 100 will be described. FIGS. 4A to 4H are cross-sectional views illustrating a method of mounting the optical semiconductor chip 200 on the wiring substrate 100 in a manufacturing method of the optical module 1 according to the first embodiment. FIGS. 4A to 4H illustrate changes of a cross-section taken along the line I-I in FIG. 2.

Figure 4A:
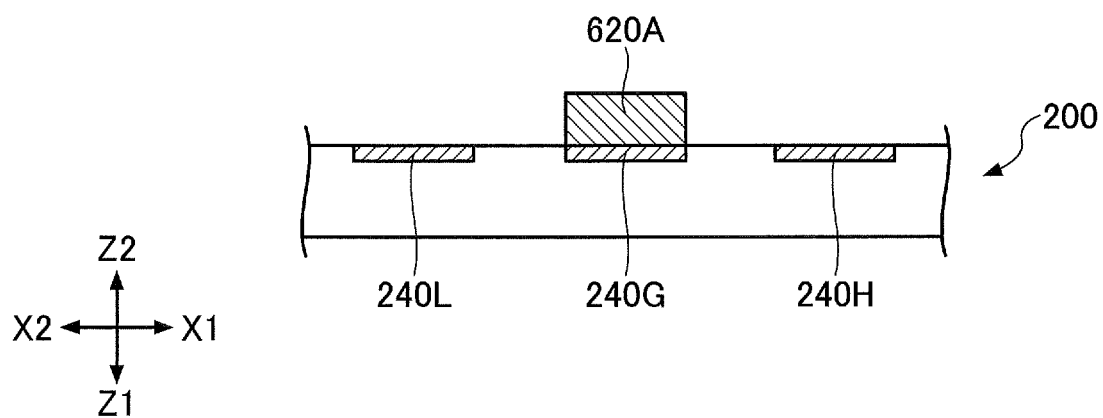
FIG. 4A is a first cross-sectional view illustrating a method of mounting an optical semiconductor chip on a wiring substrate in a manufacturing method of an optical module according to a first embodiment.

First, as illustrated in FIG. 4A, the optical semiconductor chip 200 including the electrode pad 240H, the electrode pad 240G, and the electrode pad 240L is prepared. Next, a solder paste 620A is provided in an area in which the conductive material 620GW is to be formed, including surfaces of some of the multiple electrode pads 240G. The solder paste 620A can be provided by screen printing, for example.

Figure 4B:
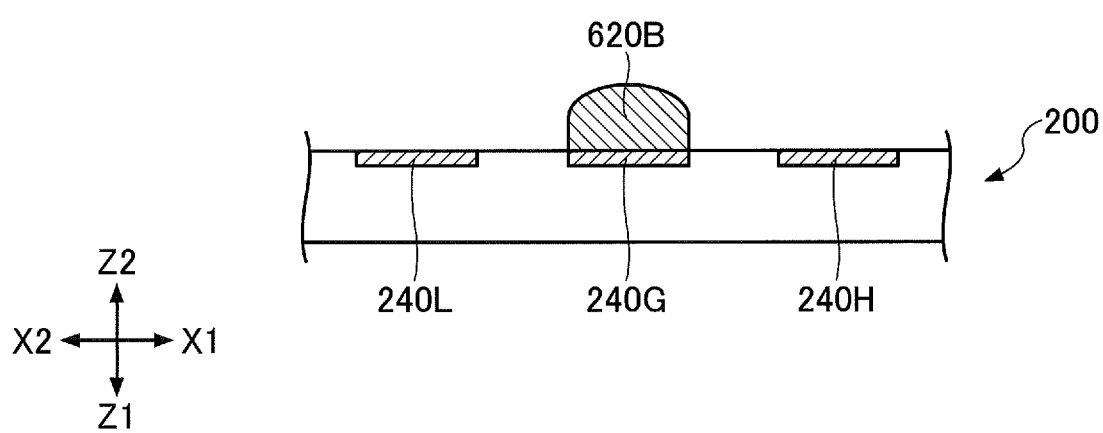
FIG. 4B is a second cross-sectional view illustrating a method of mounting an optical semiconductor chip on a wiring substrate in a manufacturing method of an optical module according to a first embodiment.

Next, as illustrated in FIG. 4B, a wall-shaped conductive material 620B is formed by reflow.

Figure 4C:
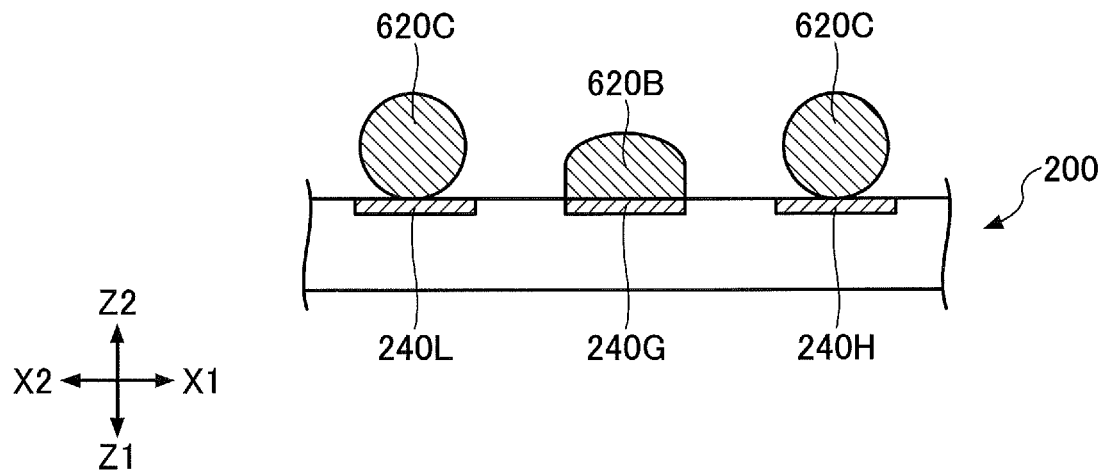
FIG. 4C is a third cross-sectional view illustrating a method of mounting an optical semiconductor chip on a wiring substrate in a manufacturing method of an optical module according to a first embodiment.

Next, as illustrated in FIG. 4C, solder balls 620C are placed on a surface of the electrode pad 240H, on a surface of the electrode pad 240L, and on a surface of a remaining electrode pad 240G (i.e., an electrode pad 240G on which the conductive material 620B is not provided among the multiple electrode pads 240G).

Figure 4D:
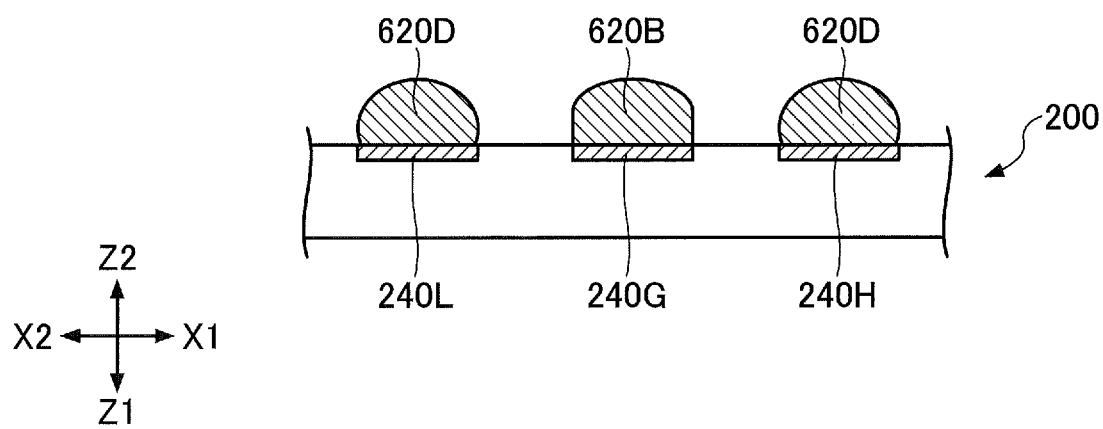
FIG. 4D is a fourth cross-sectional view illustrating a method of mounting an optical semiconductor chip on a wiring substrate in a manufacturing method of an optical module according to a first embodiment.

Subsequently, as illustrated in FIG. 4D, conductive materials 620D are individually formed by reflow, on the surface of the electrode pad 240H, on the surface of the electrode pad 240L, and on the surface of the remaining electrode pad 240G.

Figure 4E:
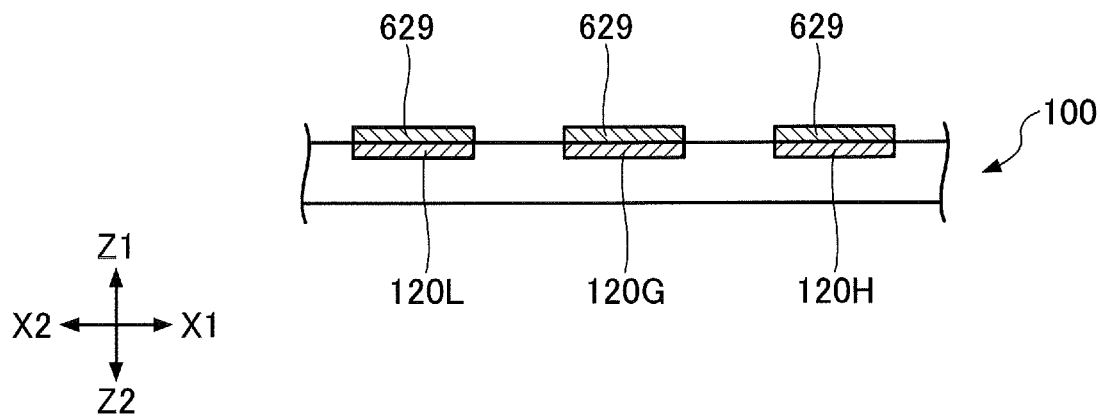
FIG. 4E is a fifth cross-sectional view illustrating a method of mounting an optical semiconductor chip on a wiring substrate in a manufacturing method of an optical module according to a first embodiment.

Additionally, as illustrated in FIG. 4E, the wiring substrate 100 including the electrode pad 120H, the electrode pad 120G, and the electrode pad 120L is prepared. Next, solder pastes 629 are provided on a surface of the electrode pad 120H, on a surface of the electrode pad 120G, and on a surface of the electrode pad 120L. The solder paste 629 can be provided by screen printing, for example. The wiring substrate 100 includes the electrode pad 130H, the electrode pad 130G, and the electrode pad 130A, which is not illustrated in FIG. 4E to FIG. 4G.

Figure 4F:
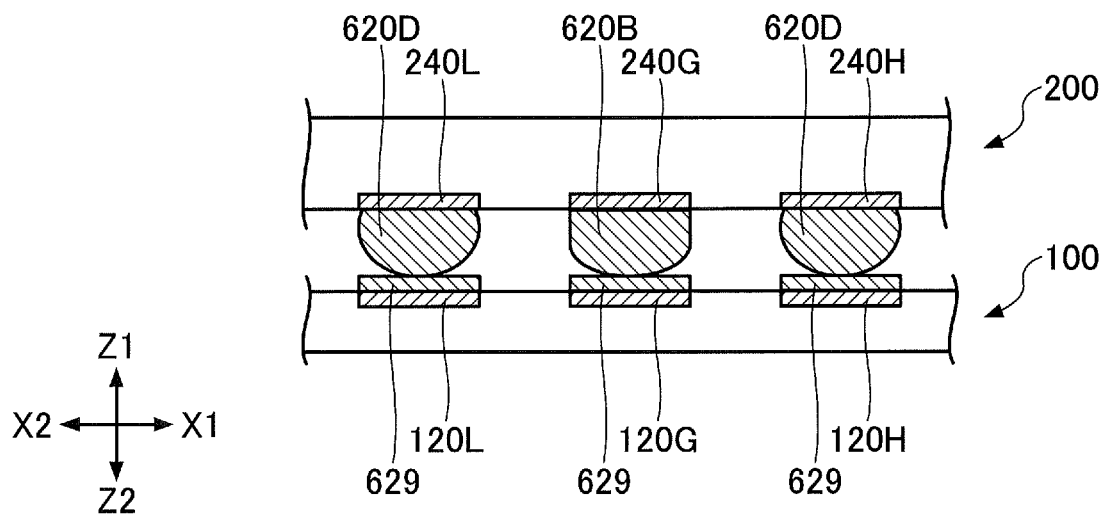
FIG. 4F is a sixth cross-sectional view illustrating a method of mounting an optical semiconductor chip on a wiring substrate in a manufacturing method of an optical module according to a first embodiment.

Next, as illustrated in FIG. 4F, the optical semiconductor chip 200 is placed on the wiring substrate 100. At this time, a position is adjusted such that the electrode pad 240H is on the electrode pad 120H, the electrode pad 240G is on the electrode pad 120G, and the electrode pad 240L is on the electrode pad 120L in planar view.

Figure 4G:
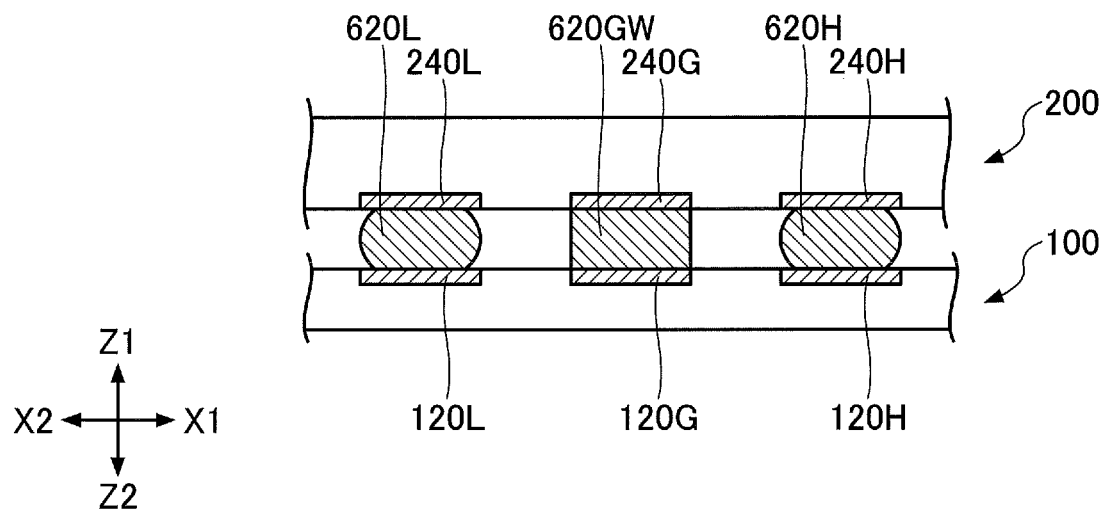
FIG. 4G is a seventh cross-sectional view illustrating a method of mounting an optical semiconductor chip on a wiring substrate in a manufacturing method of an optical module according to a first embodiment.

Subsequently, reflow is performed. As a result, as illustrated in FIG. 4G, between the electrode pad 240H and the electrode pad 120H, the solder paste 629 and the conductive material 620D are combined and a cylinder-shaped conductive material 620H is formed. Between the electrode pad 240L and the electrode pad 120L, the solder paste 629 and the conductive material 620D are combined and a cylinder-shaped conductive material 620L is formed. Between some of the multiple electrode pads 240G and the electrode pads 120G, the solder paste 629 and the conductive material 620D are combined and a cylinder-shaped conductive material 620G (see FIG. 3C) is formed. Between remaining electrode pads 240G and the electrode pads 120G, the solder paste 629 and the conductive material 620B are combined and a wall-shaped conductive material 620GW is formed. By the conductive material 620GW, a space in which the conductive material 620H is provided and a space in which the conductive material 620L is provided are separated from each other.

Figure 4H:
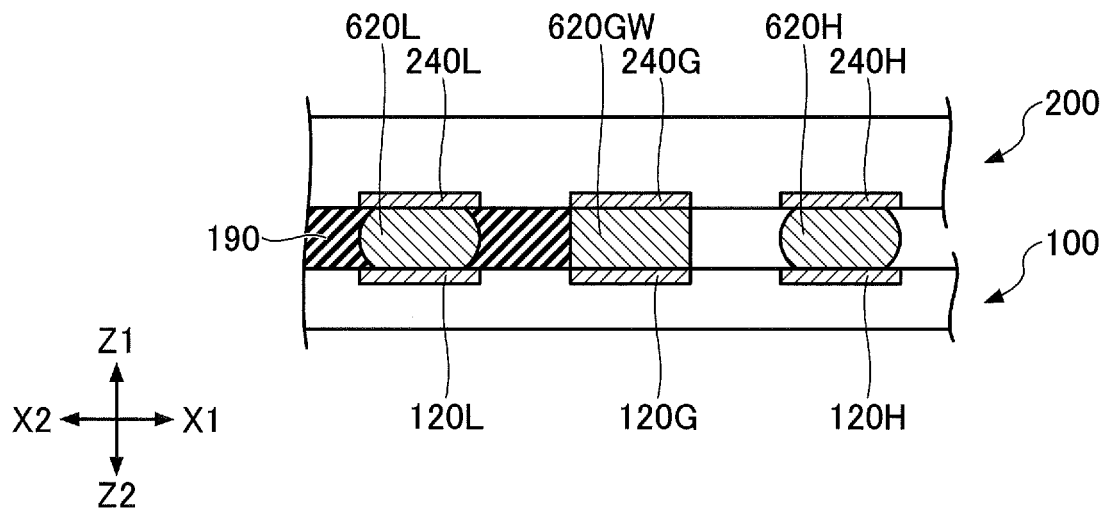
FIG. 4H is an eighth cross-sectional view illustrating a method of mounting an optical semiconductor chip on a wiring substrate in a manufacturing method of an optical module according to a first embodiment.

Next, as illustrated in FIG. 4H, a space in which the conductive material 620L is provided, between the wiring substrate 100 and the optical semiconductor chip 200, is filled with the underfill 190. As a space in which the conductive material 620H is provided and a space in which the conductive material 620L is provided are separated from each other by the conductive material 620GW, a space in which the conductive material 620H is provided is not filled with the underfill 190.

As described, the optical semiconductor chip 200 can be mounted on the wiring substrate 100.

Furthermore, the optical module 1 according to the first embodiment can be manufactured by mounting the DSP 300 and the laser 400 on the wiring substrate 100. Here, the DSP 300 may be mounted on the wiring substrate 100 in parallel with the optical semiconductor chip 200.

According to this manufacturing method, forming the conductive material 620GW can with certainty prevent the underfill 190 from flowing into a space on the conductive material 620H side in which a high-speed signal is transmitted. Additionally, as a space on the conductive material 620L side and a space on the conductive material 620H side are separated by the conductive material 620GW, it is not necessary to form a member used for only separation. Thus, it can control against an increase of a cost.

Second Embodiment

Figure 5A:
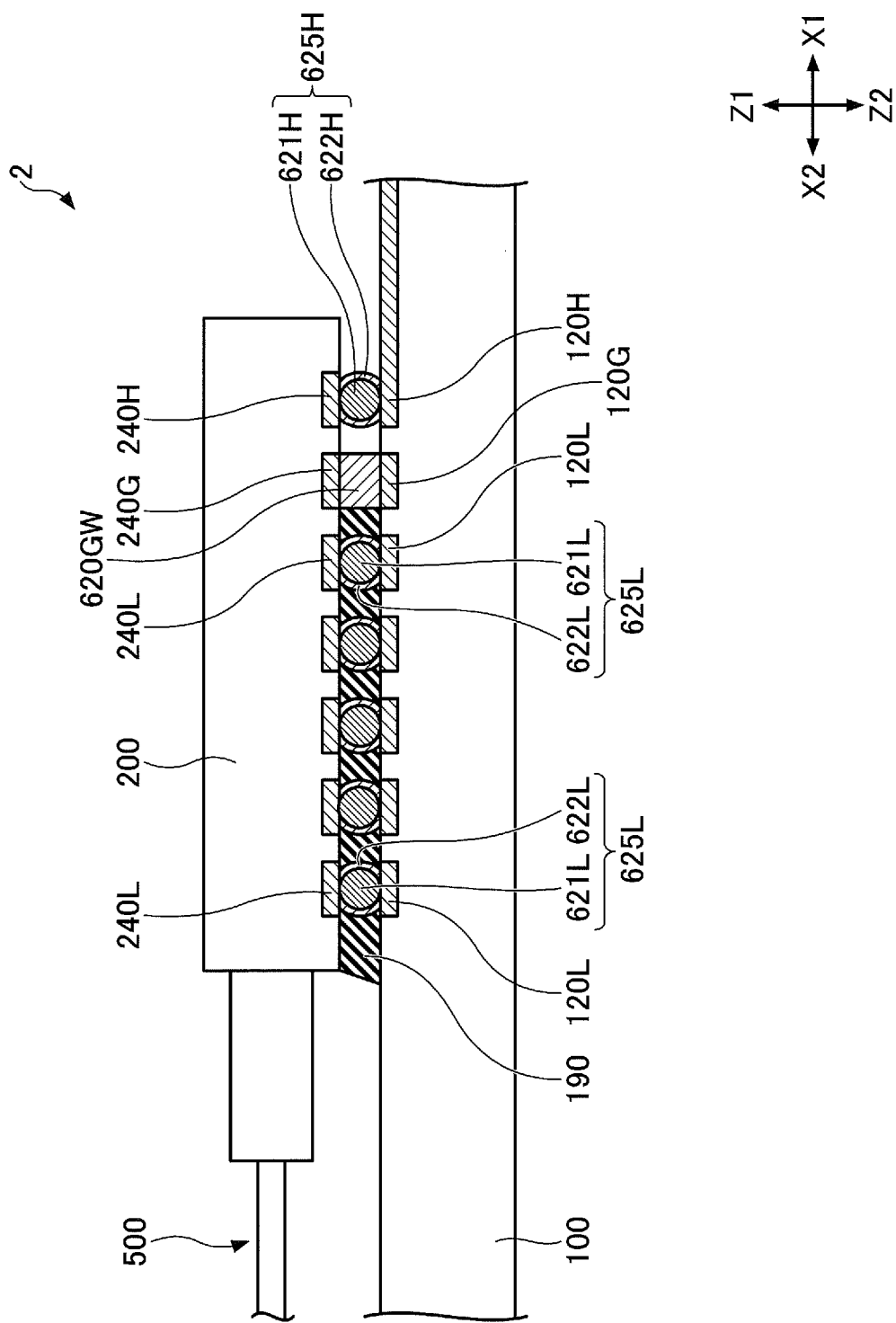
FIG. 5A is a cross-sectional view illustrating a structure of an optical module according to a second embodiment.
Figure 5B:
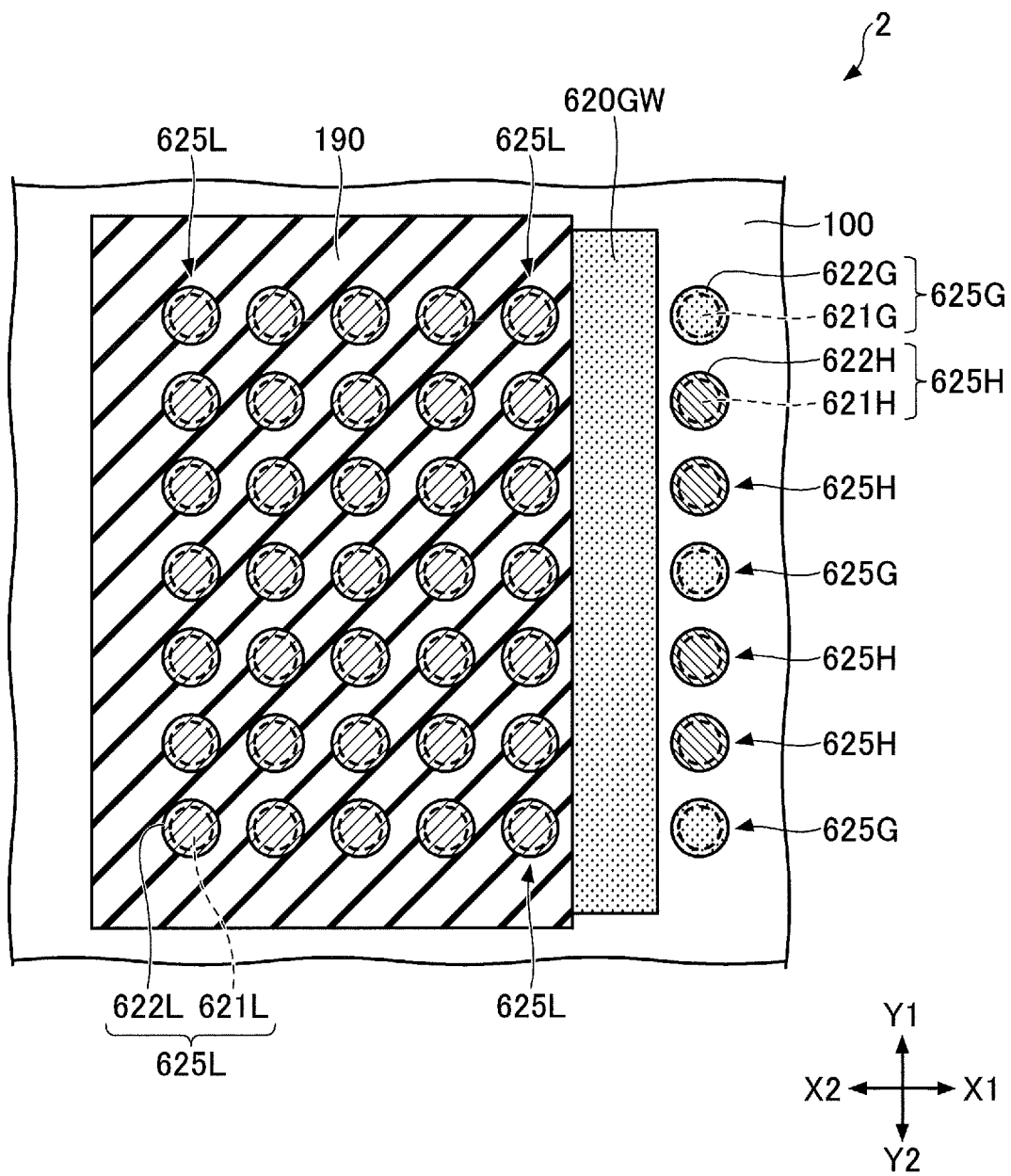
FIG. 5B is a drawing illustrating a relation between a wiring substrate, a conductive material, and underfill in a second embodiment.

Next, a second embodiment will be described. The second embodiment is different from the first embodiment in a structure of the conductive material between the optical semiconductor chip 200 and the wiring substrate 100. FIG. 5A is a cross-sectional view illustrating a structure of an optical module according to the second embodiment. FIG. 5A illustrates a part of a cross section in which the optical semiconductor chip 200 is provided, in a cross section corresponding to the cross section along the line I-I in FIG. 3A of the first embodiment. FIG. 5B is a drawing illustrating a relation between a wiring substrate, a conductive material, and underfill in the second embodiment.

As illustrated in FIG. 5A and FIG. 5B, an optical semiconductor chip 200 according to the second embodiment includes a conductive material 625H instead of the conductive material 620H, includes a conductive material 625L instead of the conductive material 620L, and includes a conductive material 625G instead of the conductive material 620G. The conductive material 625H includes a core material 621H and a conductive covering material 622H that covers the core material 621H. The conductive material 625L includes a core material 621L and a conductive covering material 622L that covers the core material 621L. The conductive material 625G includes a core material 621G and a conductive covering material 622G that covers the core material 621G. A material of the core material 621H, the core material 621L, and the core material 621G is, for example, a metal that has a higher melting point than solder such as copper and copper alloy. For a material of the core material 621H, the core material 621L, and the core material 621G, heat resistant resin may be used. Diameters of the core material 621H, the core material 621L, and the core material 621G are substantially the same.

By the second embodiment, an effect similar to the effect of the first embodiment can be obtained. Furthermore, a detail will be described later, and a distance between the wiring substrate 100 and the optical semiconductor chip 200 can be stabilized, and stability of a high-frequency characteristic can be improved.

Next, in a manufacturing method of an optical module 2 according to the second embodiment, a method of mounting the optical semiconductor chip 200 on the wiring substrate 100 will be described. FIGS. 6A to 6E are cross-sectional views illustrating a method of mounting the optical semiconductor chip 200 on the wiring substrate 100 in the manufacturing method of the optical module 2 according to the second embodiment. FIGS. 6A to 6E illustrate changes of a cross-section corresponding to the cross-section along the line I-I in FIG. 2.

Figure 6A:
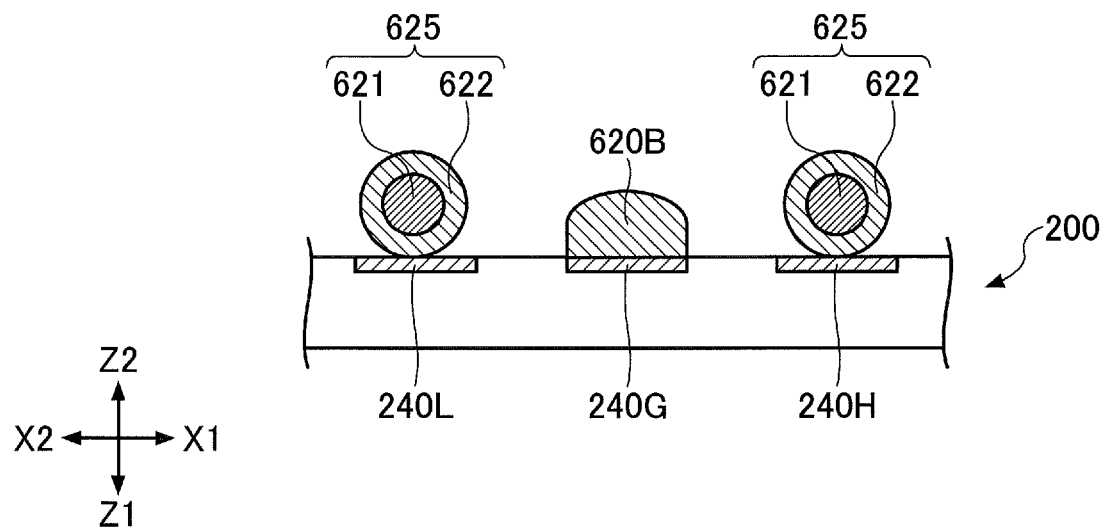
FIG. 6A is a first cross-sectional view illustrating a method of mounting an optical semiconductor chip on a wiring substrate in a manufacturing method of an optical module according to a second embodiment.

First, as in the first embodiment, a process up to forming the wall-shaped conductive material 620B is performed (see FIG. 4B). Next, as illustrated in FIG. 6A, solder balls 625 each including a core material 621 and a conductive covering material 622 that covers the core material 621 are placed on a surface of the electrode pad 240H, on a surface of the electrode pad 240L, and on a surface of a remaining electrode pad 240G (i.e., an electrode pads 240G on which the conductive material 620B is not provided among the multiple electrode pads 240G).

Figure 6B:
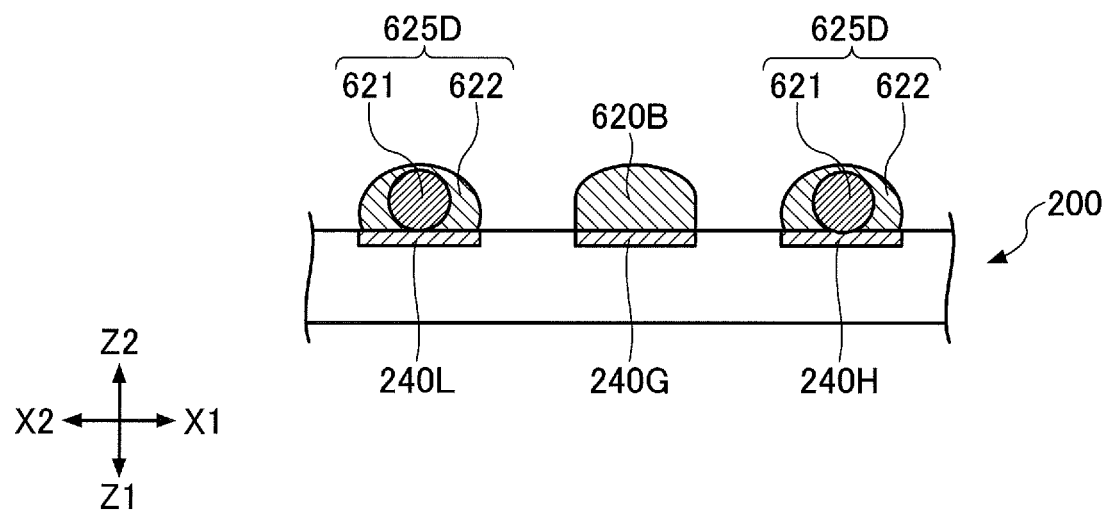
FIG. 6B is a second cross-sectional view illustrating a method of mounting an optical semiconductor chip on a wiring substrate in a manufacturing method of an optical module according to a second embodiment.

Next, as illustrated in FIG. 6B, conductive materials 625D each including the core material 621 are individually formed by reflow, on the surface of the electrode pad 240H, on the surface of the electrode pad 240L, and on the surface of the remaining electrode pad 240G.

Figure 6C:
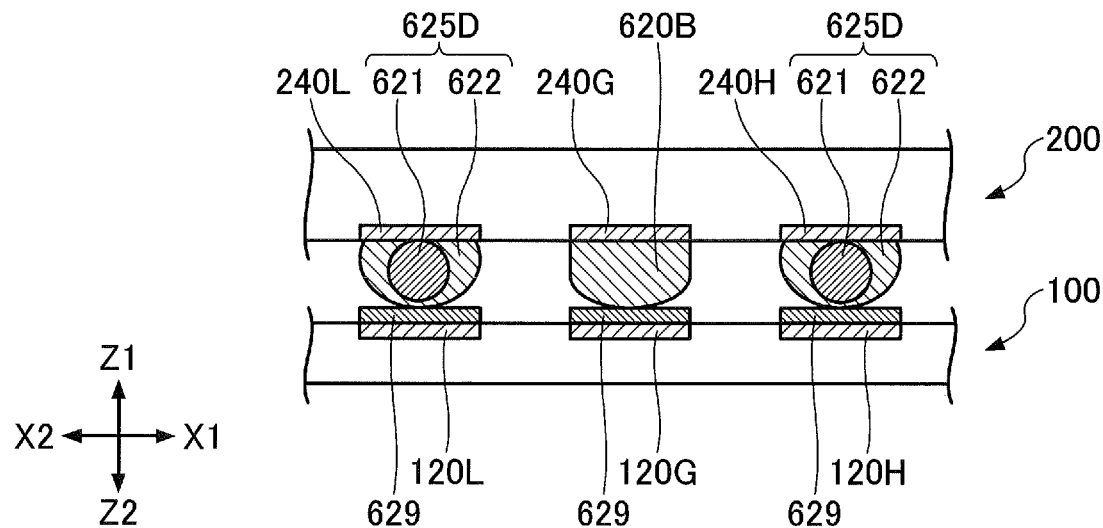
FIG. 6C is a third cross-sectional view illustrating a method of mounting an optical semiconductor chip on a wiring substrate in a manufacturing method of an optical module according to a second embodiment.

Subsequently, as illustrated in FIG. 6C, the optical semiconductor chip 200 is placed on the wiring substrate 100 on which the solder pastes 629 are provided. At this time, a position is adjusted such that the electrode pad 240H is on the electrode pad 120H, the electrode pad 240G is on the electrode pad 120G, and the electrode pad 240L is on the electrode pad 120L in planar view.

Figure 6D:
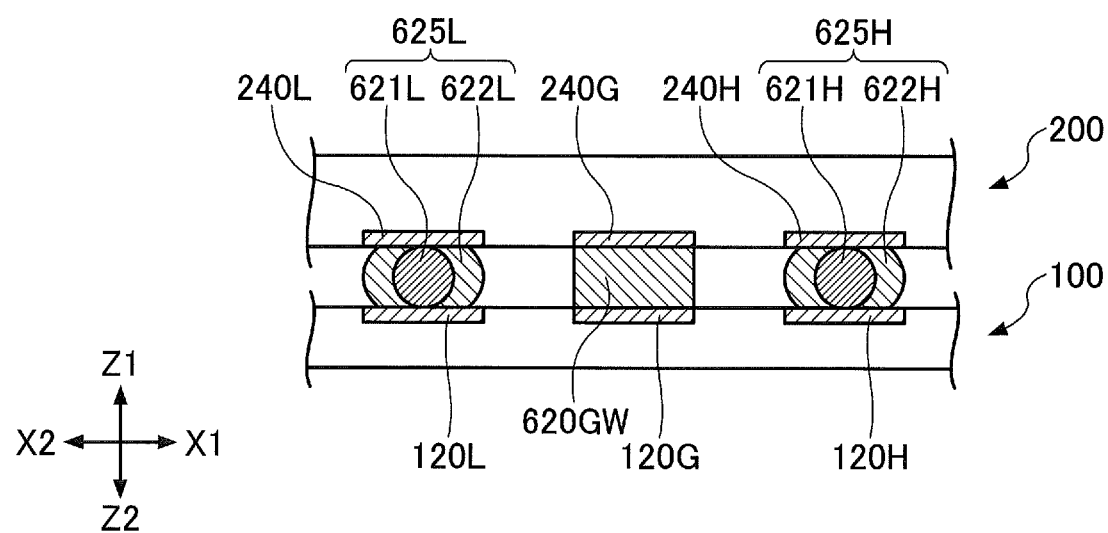
FIG. 6D is a fourth cross-sectional view illustrating a method of mounting an optical semiconductor chip on a wiring substrate in a manufacturing method of an optical module according to a second embodiment.

Next, reflow is performed. As a result, as illustrated in FIG. 6D, between the electrode pad 240H and the electrode pad 120H, the solder paste 629 and the conductive material 620D are combined and the conductive material 625H is formed. Between the electrode pad 240L and the electrode pad 120L, the solder paste 629 and the conductive material 620D are combined and the conductive material 625L is formed. Between some of the multiple electrode pads 240G and the electrode pads 120G, the solder paste 629 and the conductive material 620D are combined and a cylinder-shaped conductive material 625G (see FIG. 5B) is formed. Between remaining electrode pads 240G and the electrode pads 120G, the solder paste 629 and the conductive material 620B are combined and a wall-shaped conductive material 620GW is formed. By the conductive material 620GW, a space in which the conductive material 625H is provided and a space in which the conductive material 625L is provided are separated from each other.

Figure 6E:
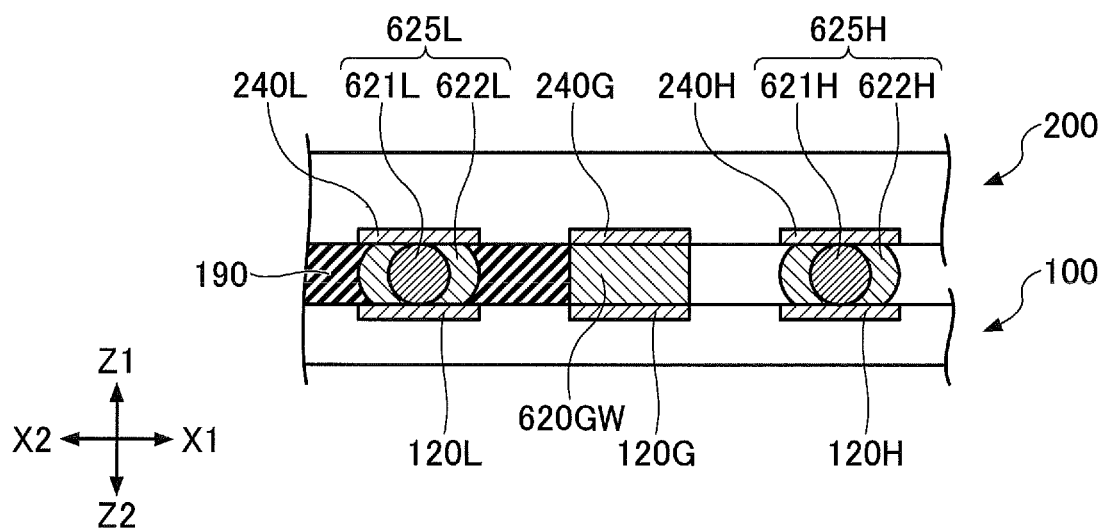
FIG. 6E is a fifth cross-sectional view illustrating a method of mounting an optical semiconductor chip on a wiring substrate in a manufacturing method of an optical module according to a second embodiment.

Subsequently, as illustrated in FIG. 6E, a space in which the conductive material 625L is provided, between the wiring substrate 100 and the optical semiconductor chip 200, is filled with the underfill 190. As a space in which the conductive material 625H is provided and a space in which the conductive material 625L is provided are separated from each other by the conductive material 620GW, a space in which the conductive material 625H is provided is not filled with the underfill 190.

As described, the optical semiconductor chip 200 can be mounted on the wiring substrate 100.

Furthermore, the optical module 1 according to the first embodiment can be manufactured by mounting the DSP 300 and the laser 400 on the wiring substrate 100. Here, the DSP 300 may be mounted on the wiring substrate 100 in parallel with the optical semiconductor chip 200.

In the second embodiment, the conductive material 625H includes the core material 621H, the conductive material 625L includes the core material 621L, and the conductive material 625G includes the core material 621G. Thus, a distance between the wiring substrate 100 and the optical semiconductor chip 200 can be stabilized. That is, in reflow after the optical semiconductor chip 200 is placed on the wiring substrate 100 (see FIG. 6C), melted conductive material 620B and melted conductive covering material 622 each produce surface tension. At this time, as the volume of the conductive covering material 622 is greater than the volume of the conductive material 620B, the conductive covering material 622 will tend to reduce a distance between the wiring substrate 100 and the optical semiconductor chip 200 more strongly than the conductive material 620B. In the first embodiment, a distance between the wiring substrate 100 and optical semiconductor chip 200 may vary. For example, a distance between the wiring substrate 100 and the optical semiconductor chip 200 may be short on an X1 side and may be long on X2 side. With respect to the above, in the second embodiment, even if the conductive covering material 622 will tend to reduce a distance between the wiring substrate 100 and the optical semiconductor chip 200 more strongly than the conductive material 620B, the core material 621H, the core material 621L, and the core material 621G are included, and it can stabilize a distance between the wiring substrate 100 and the optical semiconductor chip 200.

In a transmitting line where a high-speed signal is transmitted, it is generally important that a characteristic impedance $Z_0$ is stabilized. In focusing on the conductive material 620H and the conductive material 625H, the characteristic impedance $Z_0$ depends on inductance L with regard to heights of the conductive material 620H and the conductive material 625H, and capacitance C with regard to distances of the conductive material 620H, the conductive material 625H, and the conductive material 620GW. The characteristic impedance $Z_0$ can be expressed by $Z_0=(L/C)^{1/2}$. Thus, it is extremely preferable from a point of view of stability of a high-frequency characteristic that a distance between the wiring substrate 100 and the optical semiconductor chip 200 can be stabilized.

Figure 7:
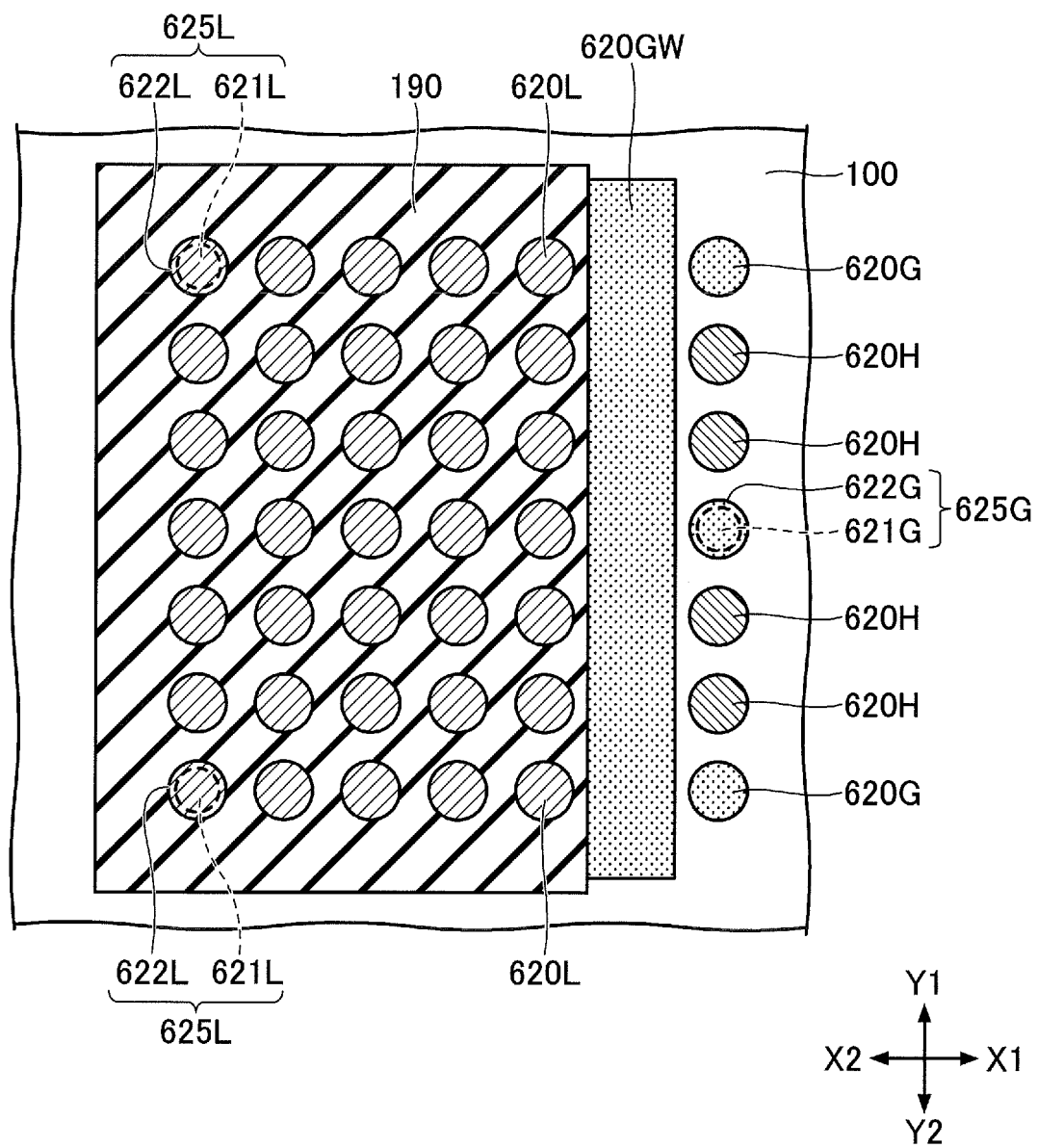
FIG. 7 is a drawing illustrating a relation between a wiring substrate, a conductive material, and underfill in a modified example of a second embodiment.

Here, it is not necessary that all conductive materials 625H include the core material 621H, all conductive materials 625L include the core material 621L, and all conductive materials 625G include the core material 621G. For example, as illustrated in FIG. 7, at least three of the conductive materials 620H, the conductive materials 620L, or the conductive materials 620G that are not on a line may each include a core material. FIG. 7 is a drawing illustrating a relation between the wiring substrate, the conductive material, and the underfill in a modified example of the second embodiment.

Instead of using the solder ball 625 including the core material 621, the distance may be stabilized by a spacer intervening between the wiring substrate 100 and the optical semiconductor chip 200, using the solder ball 620C without including a core material. Spacers can be placed on four corners of the optical semiconductor chip 200 for example.

Figure 8:
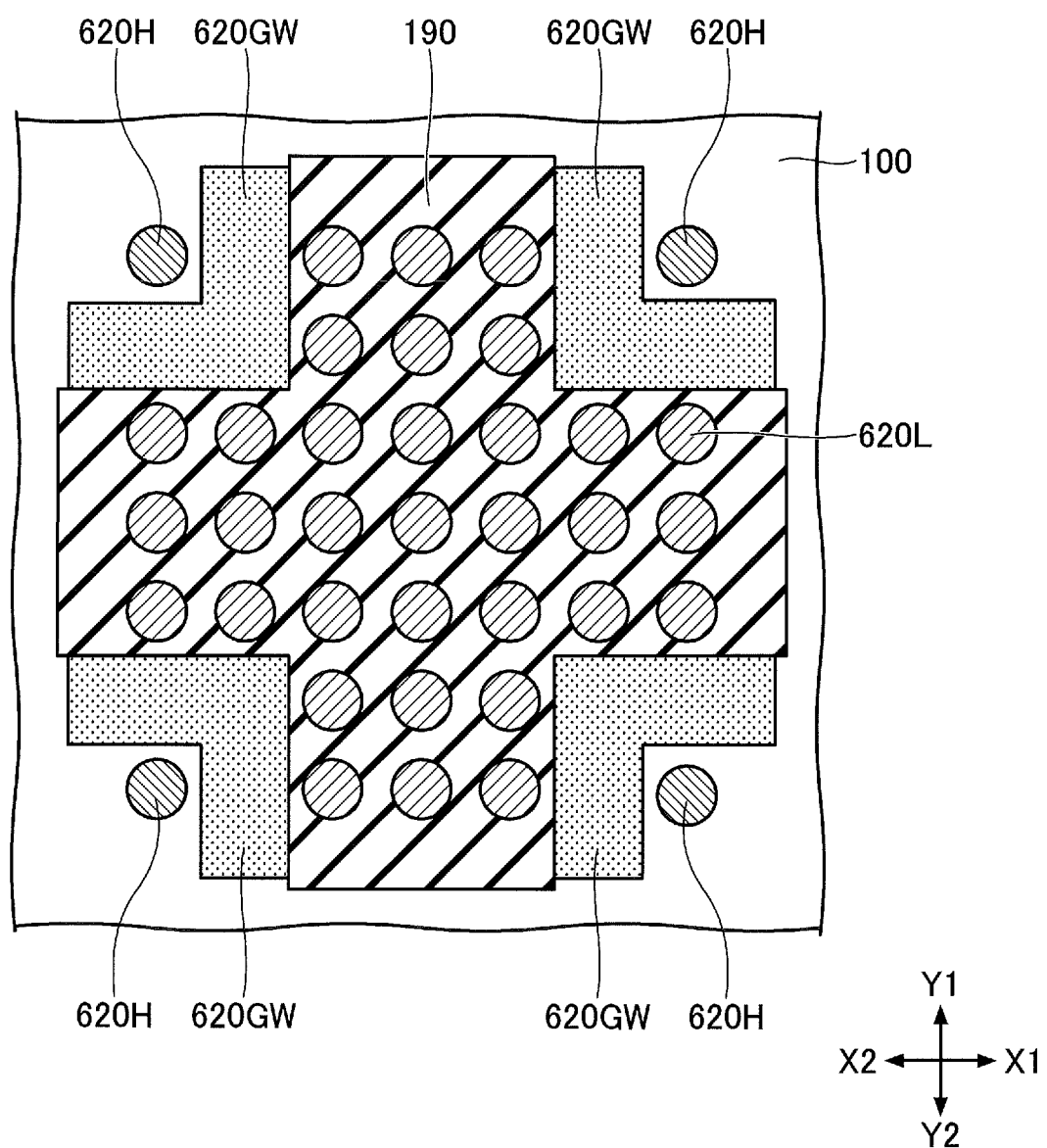
FIG. 8 is a drawing illustrating a relation between a wiring substrate, a conductive material, and underfill in a first modified example of a first embodiment.
Figure 9:
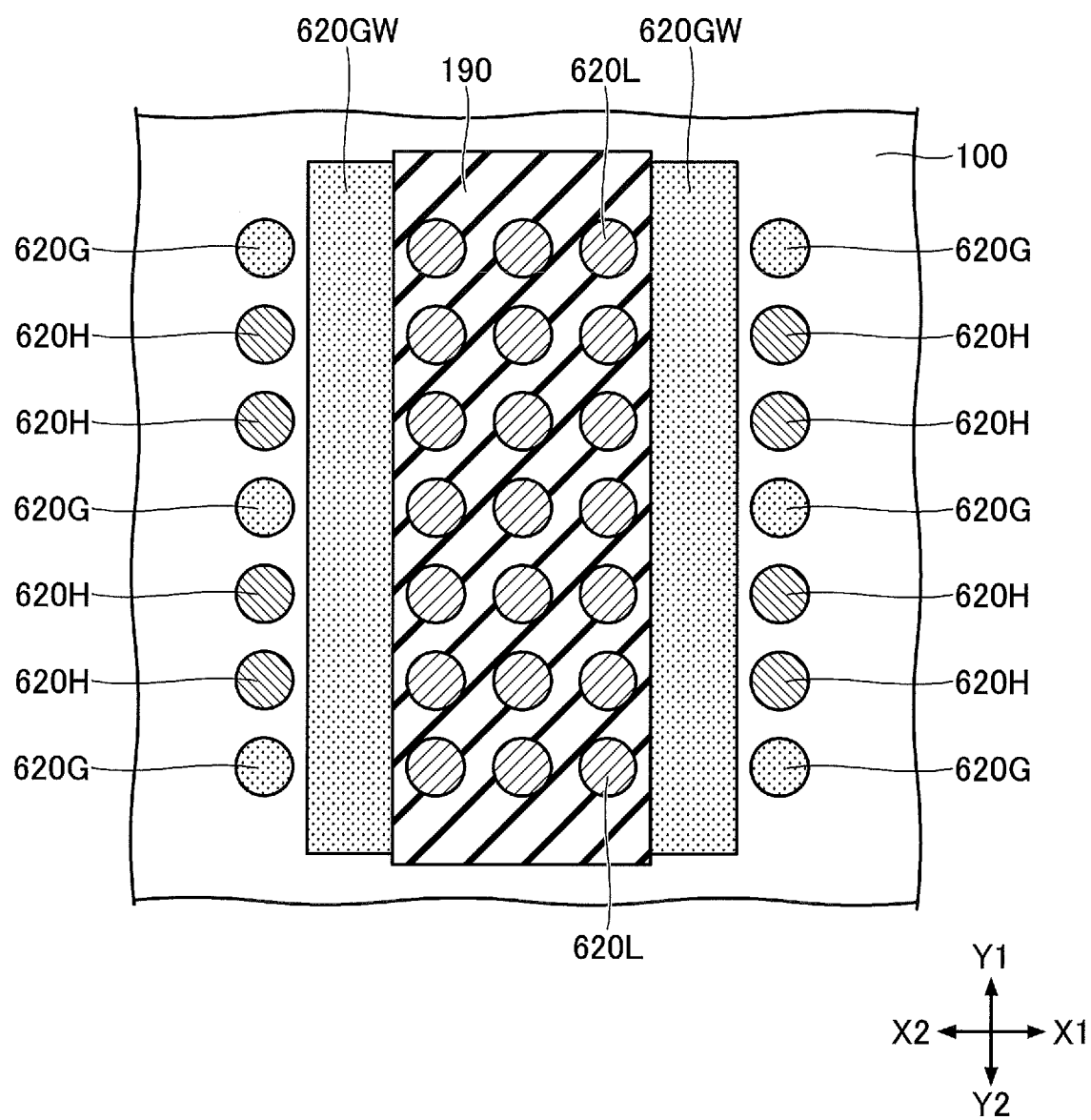
FIG. 9 is a drawing illustrating a relation between a wiring substrate, a conductive material, and underfill in a second modified example of a first embodiment.

Additionally, variations of the distance between the wiring substrate 100 and the optical semiconductor chip 200 can be reduced by symmetrical distribution of the conductive materials 620GW in the XY plane. For example, as illustrated in FIG. 8, the conductive materials 620GW may be arranged in 90° rotational symmetry. As illustrated in FIG. 9, the conductive materials 620GW may be arranged in 180° rotational symmetry. FIG. 8 is a drawing illustrating a relation between the wiring substrate, the conductive material, and the underfill in a first modified example of the first embodiment. FIG. 9 is a drawing illustrating a relation between the wiring substrate, the conductive material, and the underfill in a second modified example of the first embodiment.

Here, the conductive material 620B will tend to become a sphere by surface tension in reflow forming the conductive material 620GW. Thus, it is preferable to determine a layout of the solder paste 620A by considering a layout of the conductive material 620GW to be formed and surface tension of melted conductive material 620B. For example, the solder paste 620A can be formed with a fixed width.

Figure 10:
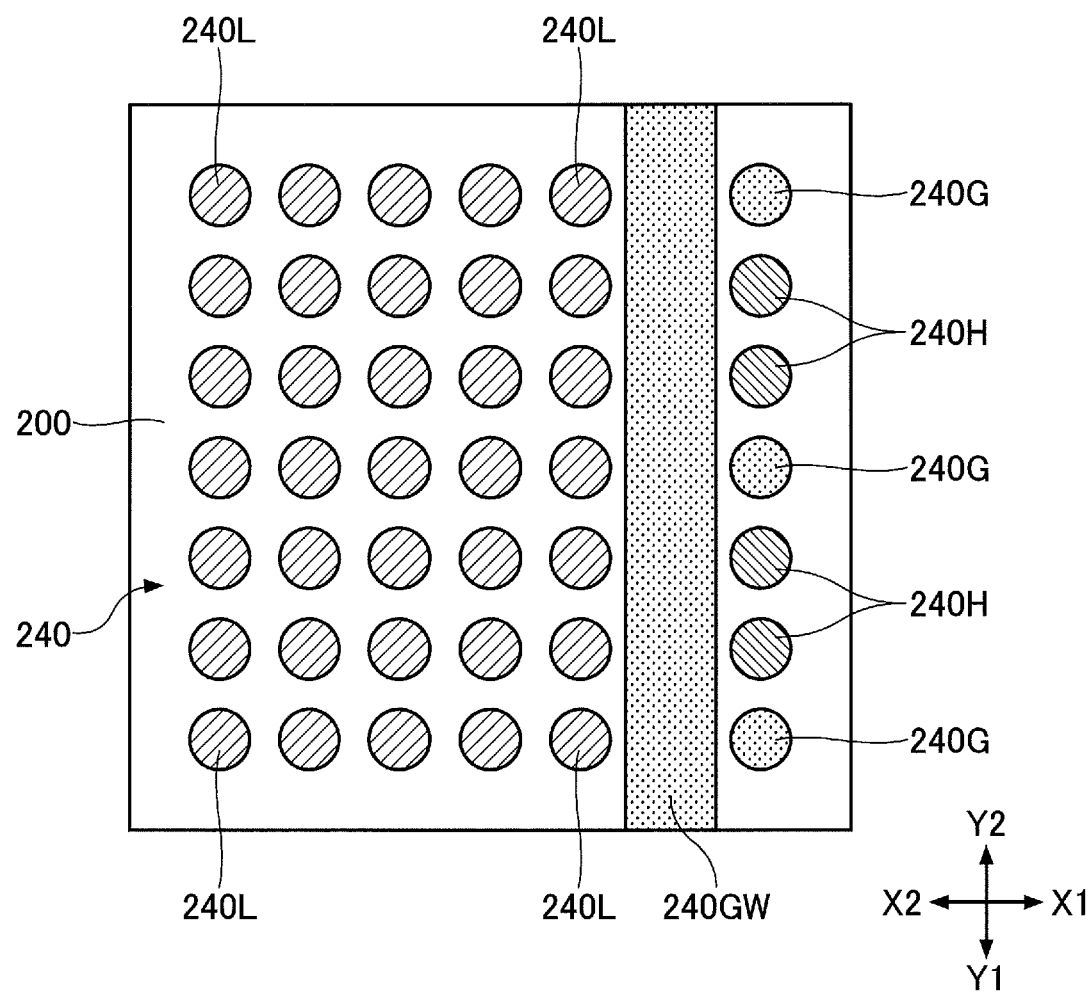
FIG. 10 is a bottom view illustrating a structure of an optical semiconductor chip in a third modified example of a first embodiment.
Figure 11:
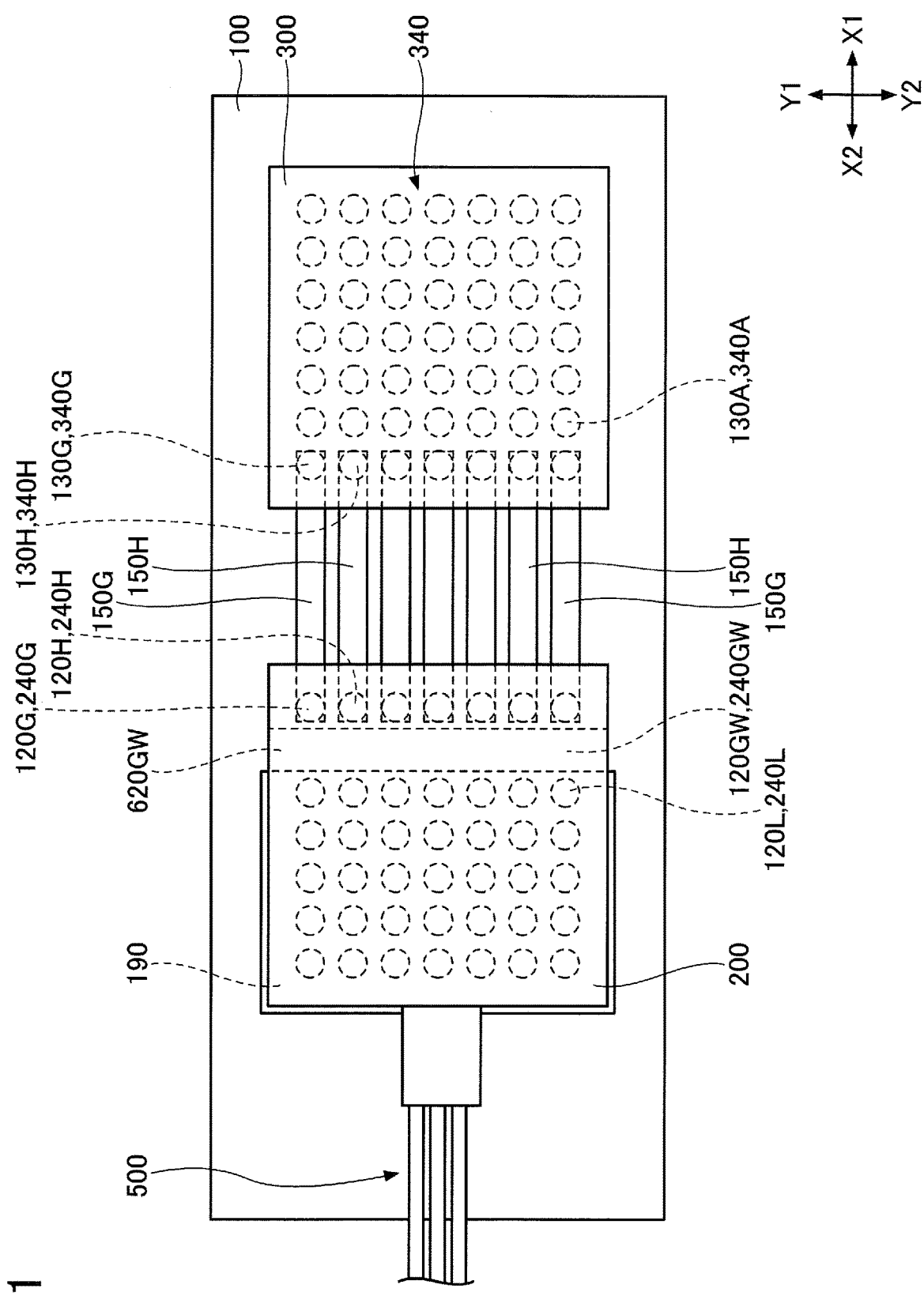
FIG. 11 is a plan view illustrating a structure of an optical module according to a third modified example of a first embodiment.

As illustrated in FIG. 10 and FIG. 11, in a direction toward a position on which a closest electrode pad 240 is arranged, multiple electrode pads 240G arranged between the electrode pad 240H and the electrode pad 240L may be combined and form a band of the electrode pad 240GW. Additionally, with respect to multiple electrode pads 120G, the multiple electrode pads 120G may be combined and form a band of the electrode pad 120GW, and the electrode pad 120GW may be electrically connected with the electrode pad 240GW. FIG. 10 is a bottom view illustrating a structure of the optical semiconductor chip 200 in a third modified example of the first embodiment. FIG. 11 is a plan view illustrating a structure of the optical module according to a third modified example of the first embodiment. The electrode pad 240GW is an example of a third electrode pad, and the electrode pad 120GW is an example of a sixth electrode pad.

In the first modified example and the second modified example of the first embodiment, and the second embodiment, as in the third modified example of the first embodiment, a band of the electrode pad 240GW may be formed, and a band of the electrode pad 120GW may be formed.

Preferred embodiments have been described in detail above. However, various changes and substitutions can be added to the embodiments described above, without limiting by the embodiments described above and without departing from the scope described in the claim.

For example, signals transmitted through the first electrode pad, the first conductive material, and the fourth electrode pad may not be differential signals.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present inventions have been described in detail, it should be understood that the various changes, substitutions, and alterations could be made hereto without departing from the spirit and scope of the invention.

What is claimed is:

1. An optical module comprising:
    an optical semiconductor chip including first electrode pads, second electrode pads, and third electrode pads, each of the third electrode pads being arranged between a corresponding first electrode pad of the first electrode pads and a corresponding second electrode pad of the second electrode pads;
    a wiring substrate on which the optical semiconductor chip is flip-chip mounted, including fourth electrode pads, fifth electrode pads, and sixth electrode pads, each of the sixth electrode pads being arranged between a corresponding fourth electrode of the fourth electrode pads and a corresponding fifth electrode of the fifth electrode pads;
    first conductive members respectively connecting the first electrode pads with the fourth electrode pads;
    second conductive members respectively connecting the second electrode pads with the fifth electrode pads;
    third conductive members respectively arranged between corresponding first conductive members of the first conductive members and corresponding second conductive members of the second conductive members, each connecting corresponding third electrode pads of the third electrode pads with corresponding sixth electrode pads of the sixth electrode pads; and
    a resin provided in an area on the second conductive members side of the third conductive members between the optical semiconductor chip and the wiring substrate,
    wherein at least three conductive members but not all conductive members of the first conductive members, the second conductive members, and the third conductive members include core members, the at least three conductive members being not on a line, and the at least three conductive members being arranged only on an outer edge of a two-dimensional array of the conductive members,
    wherein a number of conductive members that include the core members and that are not in contact with the resin is less than a number of conductive members that include the core members and that are in contact with the resin.

2. The optical module as claimed in claim 1, wherein the second conductive members are in contact with the resin, and the first conductive members are not in contact with the resin.

3. The optical module as claimed in claim 1, wherein the wiring substrate includes a coplanar line connecting to the fourth electrode pads.

4. The optical module as claimed in claim 1, wherein a first speed of a signal transmitted through the first conductive members is faster than a second speed of a signal transmitted through the second conductive members.

5. The optical module as claimed in claim 1, wherein the third electrode pads, the sixth electrode pads, and the third conductive members are grounded.

6. The optical module as claimed in claim 1, wherein maximum frequency of a signal transmitted through the first conductive members is greater than or equal to 30 GHz.

7. A manufacturing method of an optical module, the manufacturing method comprising:
    preparing an optical semiconductor chip including first electrode pads, second electrode pads, and third electrode pads, each of the third electrode pads being arranged between a corresponding first electrode pad of the first electrode pads and a corresponding second electrode pad of the second electrode pads;
    preparing a wiring substrate on which the optical semiconductor chip is flip-chip mounted, including fourth electrode pads, fifth electrode pads, and sixth electrode pads, each the sixth electrode pads being is arranged between a corresponding fourth electrode of the fourth electrode pads and a corresponding fifth electrode of the fifth electrode pads;
    forming first conductive members respectively connecting the first electrode pads with the fourth electrode pads;
    forming second conductive members respectively connecting the second electrode pads with the fifth electrode pads;
    forming third conductive members respectively arranged between corresponding first conductive members of the first conductive members and corresponding second conductive members of the second conductive members, each connecting corresponding third electrode pads of the third electrode pads with corresponding sixth electrode pads of the sixth electrode pads; and
    forming a resin in an area on the second conductive members side of the third conductive members between the optical semiconductor chip and the wiring substrate, wherein at least three conductive members but not all conductive members of the first conductive members, the second conductive members, and the third conductive members include core members, the at least three conductive members being not on a line, and the at least three conductive members being arranged only on an outer edge of a two-dimensional array of the conductive members, wherein a number of conductive members that include the core members and that are not in contact with the resin is less than a number of conductive members that include the core members and that are in contact with the resin.

8. The manufacturing method of the optical module as claimed in claim 7, wherein forming the resin includes forming the resin such that the second conductive members are in contact with the resin, and the first conductive members are not in contact with the resin.

9. The manufacturing method of the optical module as claimed in claim 7, wherein the wiring substrate includes a coplanar line connecting to the fourth electrode pads.

10. The manufacturing method of the optical module as claimed in claim 7, wherein a first speed of a signal transmitted through the first conductive members is faster than a second speed of a signal transmitted through the second conductive members.

11. The manufacturing method of the optical module as claimed in claim 7, wherein the third electrode pads, the sixth electrode pads, and the third conductive members are grounded.

12. The manufacturing method of the optical module as claimed in claim 7, wherein maximum frequency of a signal transmitted through the first conductive members is greater than or equal to 30 GHz.

13. The optical module as claimed in claim 1, wherein the at least three conductive members including core members being spaced apart from one another by at least one conductive member without a core member.

14. The manufacturing method of the optical module as claimed in claim 7, wherein the at least three conductive members including core members being spaced apart from one another by at least one conductive member without a core member.

* * * * *